United States Patent
Mihara

(10) Patent No.: US 8,482,097 B2
(45) Date of Patent: Jul. 9, 2013

(54) SEMICONDUCTOR DEVICE

(75) Inventor: Satoru Mihara, Tokyo (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/606,673

(22) Filed: Sep. 7, 2012

(65) Prior Publication Data

US 2012/0326273 A1    Dec. 27, 2012

Related U.S. Application Data

(62) Division of application No. 12/533,472, filed on Jul. 31, 2009, now Pat. No. 8,283,235.

(30) Foreign Application Priority Data

Aug. 4, 2008 (JP) .................................. 2008-200760

(51) Int. Cl.
*H01L 21/20* (2006.01)

(52) U.S. Cl.
USPC .................. 257/532; 257/306; 257/E21.017; 438/396; 438/253

(58) Field of Classification Search
USPC .................. 257/532, 306, E21.017; 438/396, 438/253
See application file for complete search history.

(56) References Cited

U.S. PATENT DOCUMENTS

| | | | | |
|---|---|---|---|---|
| 5,945,702 A | * | 8/1999 | Nakanishi | 257/296 |
| 6,533,948 B2 | | 3/2003 | Kato et al. | |
| 2005/0077521 A1 | * | 4/2005 | Yoo et al. | 257/72 |
| 2005/0170564 A1 | * | 8/2005 | Lai | 438/149 |
| 2005/0255664 A1 | * | 11/2005 | Kao et al. | 438/396 |
| 2006/0091438 A1 | * | 5/2006 | Takamatsu et al. | 257/295 |

FOREIGN PATENT DOCUMENTS

| | | |
|---|---|---|
| JP | 2000150809 A | 5/2000 |
| JP | 2001244432 A | 9/2001 |
| JP | 2003152108 A | 5/2003 |

* cited by examiner

*Primary Examiner* — Steven J Fulk
(74) *Attorney, Agent, or Firm* — Westerman, Hattori, Daniels & Adrian, LLP

(57) ABSTRACT

A method of manufacturing a semiconductor device including a plurality of capacitors each of which has bottom electrode, dielectric layer, and top electrode includes stacking a bottom electrode layer, a dielectric layer and an top electrode layer, patterning the top electrode layer to form a plurality of top electrodes arranged in a column, forming a mask pattern that covers the plurality of top electrodes and leaves an end part of the outermost top electrode of the arrangement of the plurality of top electrodes exposed, and patterning the dielectric layer using the mask pattern.

8 Claims, 16 Drawing Sheets

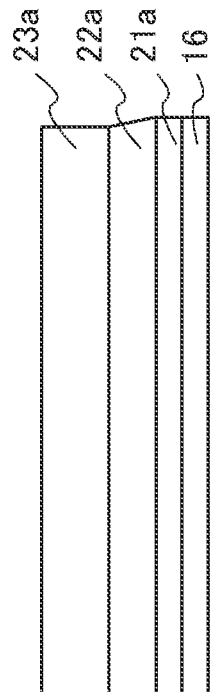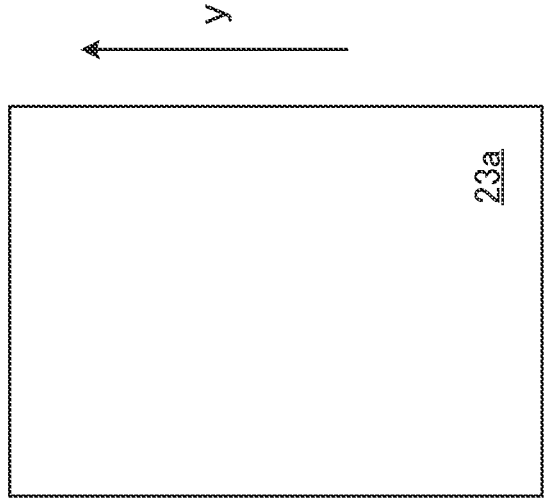

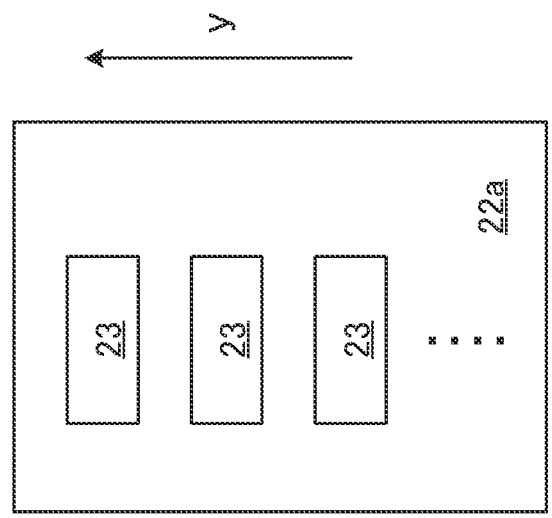

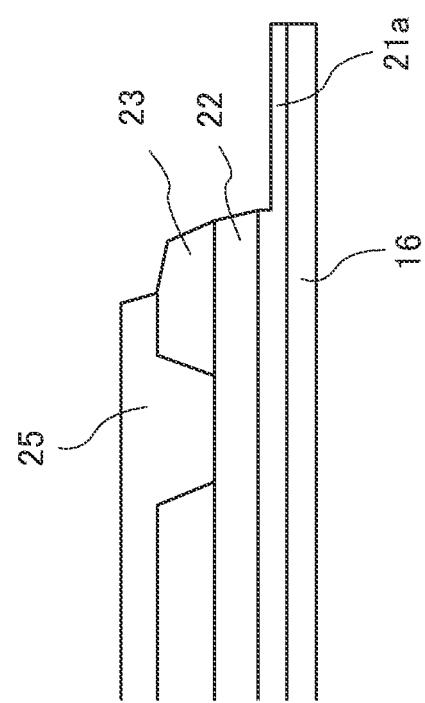

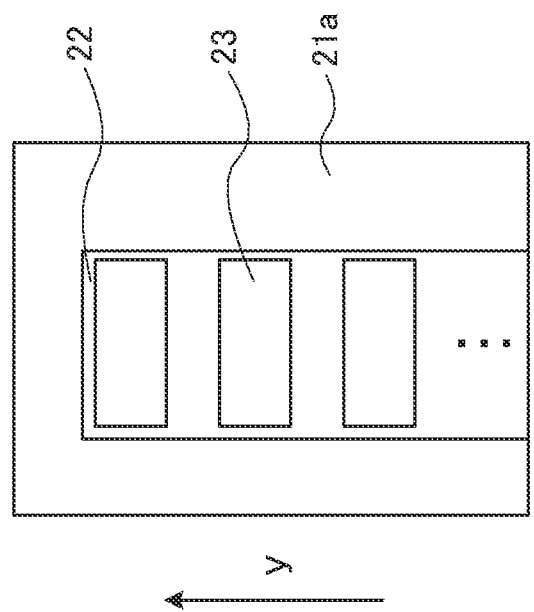

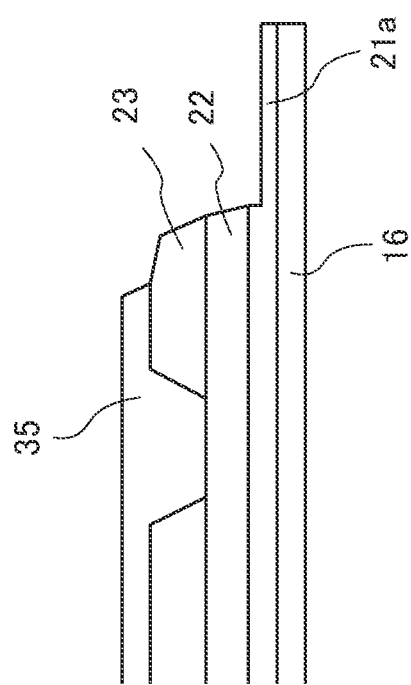

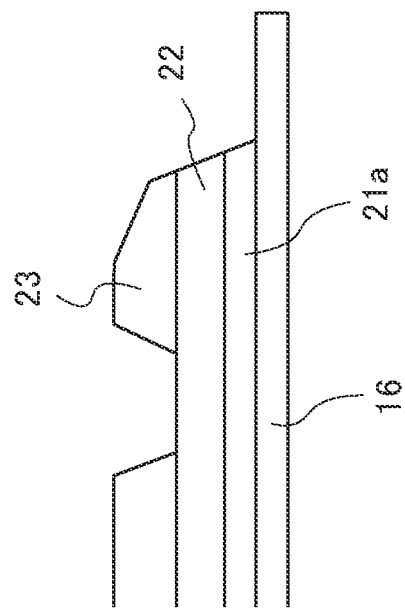
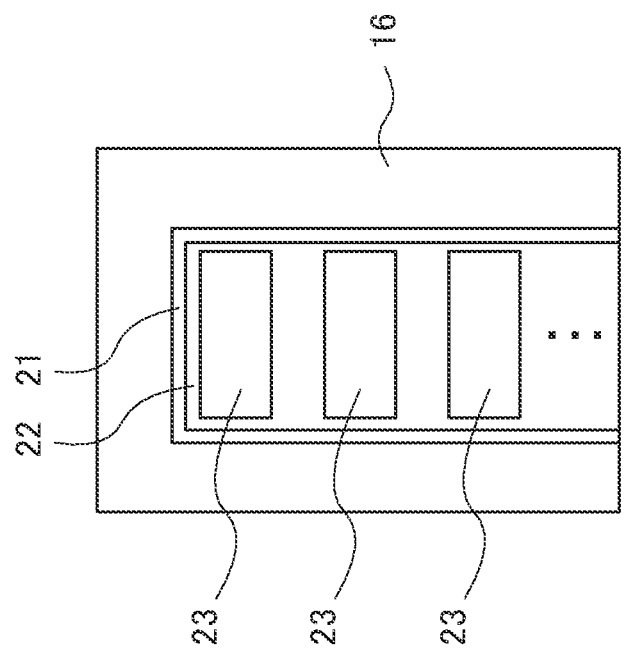

SEMICONDUCTOR DEVICE

CROSS-REFERENCE TO RELATED APPLICATIONS

This application is a divisional of U.S. patent application Ser. No. 12/533,472, filed on Jul. 31, 2009, still pending, both this application and U.S. patent application Ser. No. 12/533, 472 claim the benefit of priority from the prior Japanese Patent Application No. 2008-200760 filed on Aug. 4, 2008, the entire contents of which are incorporated herein by reference.

FIELD

The present invention relates to a method of manufacturing a semiconductor device and a semiconductor device.

BACKGROUND

Memory cells of conventional semiconductor devices have a dielectric capacitor, for example. The dielectric capacitor includes a bottom electrode, a dielectric layer and a top electrode stacked on one another in this order.

Typically, such semiconductor devices are formed by sequentially forming the top electrode, the ferroelectric layer and the bottom electrode by patterning using different masks. In this process, for example, an array of a plurality of top electrodes arranged in columns and rows is formed by patterning, and then, a dielectric layer is patterned by using a mask that integrally covers a plurality of top electrodes arranged in a column or row and a peripheral region thereof. Similarly, the bottom electrode is formed by patterning using a mask that integrally covers the column or row of top electrodes, the dielectric layer and the peripheral region thereof.

In general, etching of a layer of a material, such as a conductor and a dielectric, depends on the density of the pattern.

For example, in the case where capacitors 50 are arranged in a matrix as depicted in FIGS. 9A and 9B, a top electrode 23, a dielectric layer 22a, a bottom electrode layer 21a or the like is etched in sparse regions (upper and right regions in FIG. 9A) or adjacent regions. When the dielectric layer is etched in the sparse regions, a reaction product 56 is likely to be deposited on the side wall of a mask 55 as depicted in FIG. 9B. After the mask 55 is removed, the deposited reaction product 56 remains in the form of a fence-like residue.

The fence-like residue causes degradation of coverage of a protective film formed on the capacitors. In addition, the fence-like residue causes leakage between capacitors and thus deteriorates the characteristics of the semiconductor device.

To solve the problem, in Japanese Patent Laid-Open No. 2000-150809, there is described a method that does not suffer from the effect of a fence-like residue of a reaction product that occurs in etching of a dielectric layer by adapting the shape of a bottom electrode and a dielectric layer.

In addition, in Japanese Laid-Open Patent Publication No. 2003-152108, there is described a method that overetches a conductive layer or dielectric layer using a mask whose upper surface is rounded, thereby preventing adhesion of a reaction product having a low vapor pressure to the side wall of the mask.

In addition, in Japanese Laid-Open Patent Publication No. 2001-244432, there is described a method that removes a reaction product adhering to the side wall of a mask by cleaning the side wall with phosphoric acid after etching.

SUMMARY

Aspects of embodiments, include a method of manufacturing a semiconductor device forming a plurality of capacitors each of which has bottom electrode, dielectric layer, and top electrode the method includes stacking a bottom electrode layer, a dielectric layer and an top electrode layer, patterning the top electrode layer to form a plurality of top electrodes arranged in a column, forming a mask pattern that covers the plurality of top electrodes and leaves an end part of the outermost top electrode of the arrangement of the plurality of top electrodes exposed, and patterning the dielectric layer using the mask pattern.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIGS. 2A to 2H are schematic cross-sectional views illustrating a manufacturing method of a semiconductor device according to the present embodiment;

FIGS. 4A to 4F are schematic cross-sectional views illustrating a manufacturing method of a semiconductor device according to another embodiment;

DESCRIPTION OF EMBODIMENTS

As described previously, if the shape of a bottom electrode and a dielectric layer, the shape of a mask or the like is changed to prevent deterioration of the characteristics of a semiconductor device, the manufacturing process becomes complicated, and thus the manufacturing cost increases. In particular, if the process for changing the shape does not have adequate controllability and reproducibility, the shape may be disadvantageously unstable.

In addition, it may be difficult to adequately remove the reaction product by cleaning after etching. Thus, it may still be difficult to produce a reliable semiconductor device.

Preferred embodiments will be explained with reference to accompanying drawings.

First Embodiment

Figure 1:
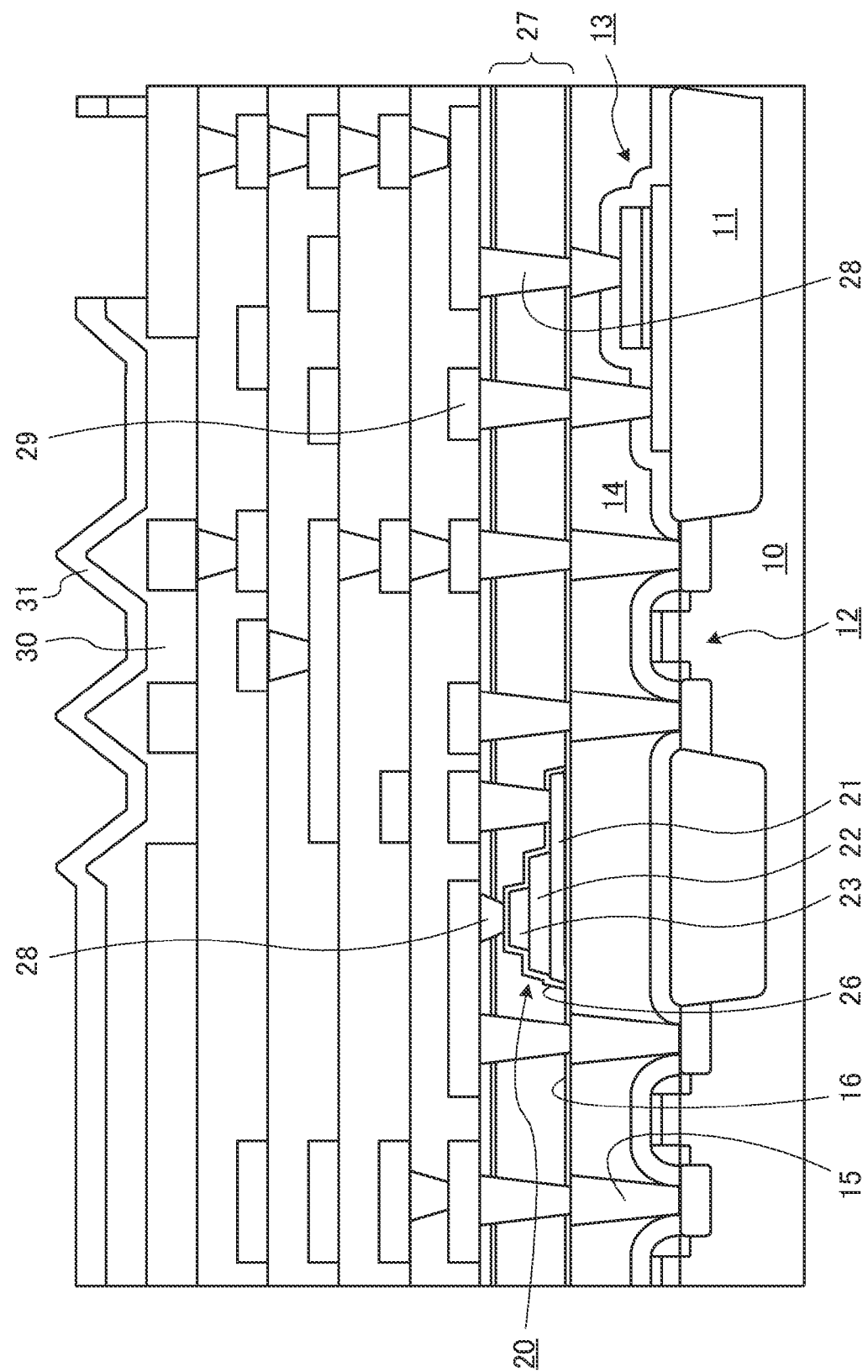
FIG. 1 is a schematic cross-sectional view of a semiconductor device manufactured according to an embodiment.

First, a substrate is prepared. For example, as depicted in FIG. 1, a device isolation film 11, a MOS transistor 12, a capacitor 13, a first interlayer film 14, a first plug 15 formed in the first interlayer film 14, a first oxidation resistant film 16 and the like are formed on a substrate 10.

The first interlayer film 14 is formed by stacking a plasma SiO film (having a thickness of about 20 nm), a plasma SiN film (having a thickness of about 80 nm), and a plasma TEOS (tetraethoxysilane) film (having a thickness of about 1000 nm) on one another in this order and planarizing the surface of the first interlayer film 14 by e.g., chemical mechanical polishing (CMP). The residual film thickness of the first interlayer film 14 may be about 700 nm, for example.

The first plug 15 is embedded in a hole having a diameter of about 0.25 μm formed in the first interlayer film 14. The first plug 15 may be formed by stacking a glue film (of Ti having a thickness of about 30 nm) and a TiN film (having a thickness of about 20 nm) on one another in this order, further forming a tungsten film on the stack by e.g., chemical vapor deposition (CVD), and polishing the stack by e.g., CMP.

The first oxidation resistant film 16 is formed over the first interlayer film 14 and the first plug 15. In this embodiment, the first oxidation resistant film 16 may be formed by stacking a SiON film (having a thickness of about 100 nm) and a plasma TEOS film (having a thickness of about 130 nm) on one another in this order. The first oxidation resistant film 16 prevents oxidation of the first plug 15 by thermal annealing in an oxygen atmosphere in formation of a ferroelectric capacitor described later.

On the substrate 10, not only the MOS transistor and the like described above but also one or more other various elements, circuits, conductive layers, insulating layers and the like may be formed. In addition, the material, thickness and/or stack configuration of the conductive layers, insulating layers and the like are not limited to those described above, and any material, thickness and/or stack configuration known in the art may be used to provide various semiconductor devices. Further, a layer is considered as being formed "on" another layer or a substrate when formed either directly on the referenced layer or the substrate or formed on other layers or patterns overlaying the referenced layer.

Then, a plurality of capacitors 20 is formed.

In this embodiment, the capacitor 20 may be a capacitor that has a dielectric layer 22 of a ferroelectric, a high dielectric, an antiferroelectric or the like sandwiched between a top electrode 23 and a bottom electrode 21. Specifically, the capacitor 20 may be a capacitor that has a layer of a PZT ferroelectric, such as $PZT(PbZr_xTi_{1-x}O_3)$, $PLZT(Pb_yLa_{1-y}Zr_xTi_{1-x}O_3)$ and $PLCSZT((Pb, La, Ca, Sr)(Zr, Ti)O_2)$, a Bi layer structure compound, such as $SrBi_2Ta_2O_9$(SBT, Y1), $SrBi_2(Ta, Nb)_2O_9$(SBTN, YZ), $(Bi, La)_4Ti_3O_{12}$(BLT) and $Bi_4Ti_3O_{12}$, a metal oxide ferroelectric, such as barium titanate and lead titanate, a bismuth ferrite ferroelectric, a high dielectric, such as $SrTiO_3$ and $(Ba, Sr)TiO_3$, an antiferroelectric, such as lead zirconate ($PbZrO_3$), for example. The thickness of the dielectric layer 22 is not limited to a particular value and may be approximately 100 nm to 300 nm, for example.

The top electrode 23 and the bottom electrode 21 of the capacitor 20 may be made of any conductive material without a particular limitation and may be formed by a single layer film or a multilayer film of a metal or an alloy. For example, the top electrode 23 and the bottom electrode 21 may be made of Ir, IrOx, Pt, SRO, LNO, LSCO, Ru, $RuO_2$ and/or $SrRuO_3$. The thickness of the top electrode 23 and the bottom electrode 21 is not limited to a particular value and may be approximately 100 nm to 300 nm, for example. The top electrode 23 and the bottom electrode 21 may be made of substantially the same material and/or have substantially the same thickness or made of different materials and/or have different thicknesses.

Typically, a plurality of capacitors 20 may be regularly or irregularly arranged in various directions including the longitudinal, lateral and oblique directions on a substrate. In particular, the capacitors 20 may be preferably regularly arranged in the longitudinal and lateral direction, that is, in a matrix. Therefore, a first direction in which the capacitors are arranged means an arbitrary one of the directions of arrangement of the capacitors. In the case where the capacitors are irregularly arranged, the arbitrary direction may be determined by interpolation or extrapolation. For example, the first direction may be a direction parallel with one side of dielectric capacitors having a substantially rectangular shape regularly arranged.

A protective base film 16 (made of AlO and having a thickness of about 20 nm) may be preferably previously formed under the capacitor 20. The protective base film 16 may prevent abnormal oxidation of the plug 15 during annealing (oxygen annealing, for example) described later. In addition, the protective base film 16 may prevent emission of hydrogen from the plug 15 during formation of the plug 15 described later.

As depicted in FIGS. 2A and 2B, on the protective base film 16, a bottom electrode layer 21a (made of Pt and having a thickness of about 150 nm), a dielectric layer 22a (made of PZT and having a thickness of about 140 nm) and a top electrode layer 23a (made of IrOx and having a thickness of about 250 nm) are formed in this order.

Then, a TiN film (having a thickness of about 20 nm) is formed on the top electrode layer 23a, and a resist layer is applied to the upper surface of the TiN film. The resist layer may be patterned into a desired shape by exposure and development, thereby forming a mask.

Then, using a type of apparatus that produces inductively coupled plasma (ICP), for example, the top electrode layer may be etched using e.g., a $Cl_2$/Ar-based etching gas and the patterned mask. In this way, a plurality of top electrodes 23 having a substantially rectangular shape arranged in a column in one direction (y direction, for example) as depicted in FIG. 2C is formed. Using the ICP apparatus and/or etching gas described above allows precise and efficient patterning of the material layers of the capacitors.

Then, a thermal treatment may be carried out in an oxygen atmosphere at a temperature of 500 to 750 degrees C., for example, 650 degrees C.

Figure 2D:
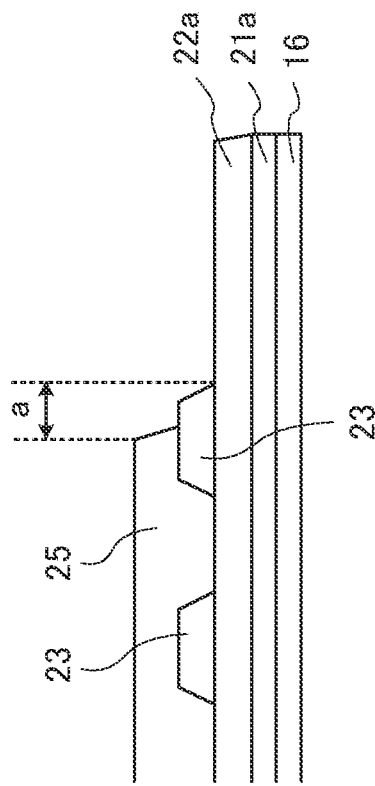
Figure 2E:
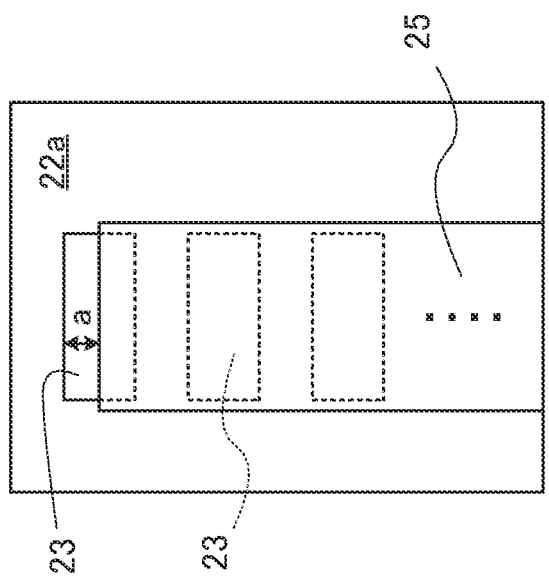

Furthermore, a resist layer is applied to the upper surface of the top electrodes 23 and patterned by exposure and development to form a mask 25 for etching of the dielectric layer 22a as depicted in FIGS. 2D and 2E.

As depicted in FIGS. 2D and 2E, the mask 25 may be formed in such a manner that one end part (upper end part in FIG. 2D) of the outermost top electrode 23 at one end (upper end in FIG. 2D) of the arrangement of the top electrodes 23 in the y direction, for example, is exposed. The one end part of the outermost top electrode 23 at one end of the arrangement may be referred to also as the outer end part of the outermost top electrode 23 of the arrangement of the top electrodes 23 of the capacitors 20 in the y direction, for example. Furthermore, it may be referred to also as the end part of the top electrode 23 of the capacitor 20 that has no adjacent capacitor 20. The width of the exposed part of the top electrode 23 is not limited to a particular value. However, in general, there is a problem concerning the mask alignment accuracy in patterning, for example, and therefore, the width is preferably determined by taking the mask misalignment into account. In this embodiment, the width of the exposed part of the top electrode 23 (denoted by "a" in FIGS. 2D and 2E) may be about 0.2 μm. The mask 25 integrally covers a plurality of the top electrodes 23 including the partially covered top electrode 23 at one end (upper end in FIG. 2D, for example) of the arrangement of the top electrodes 23. The number of the top electrodes 23 arranged in the y direction and integrally covered by the one mask 25 is not limited to a particular value, and the mask 25 may cover any plural number of the top electrodes 23.

Then, using the ICP type apparatus, for example, the dielectric layer may be etched using e.g., the $Cl_2$/Ar-based etching gas. In this process, as depicted in FIG. 2F, since the end part of the outermost top electrode 23 is exposed from the mask 25, the end part of the top electrode 23 may be also etched during etching of the dielectric layer 22a in the vicinity of the outermost top electrode 23. Thus, the thickness of the outermost top electrode 23 decreases in the y direction. Thus, the outermost top electrode 23 has a shape different from the shape of the other top electrodes 23.

Figure 2H:
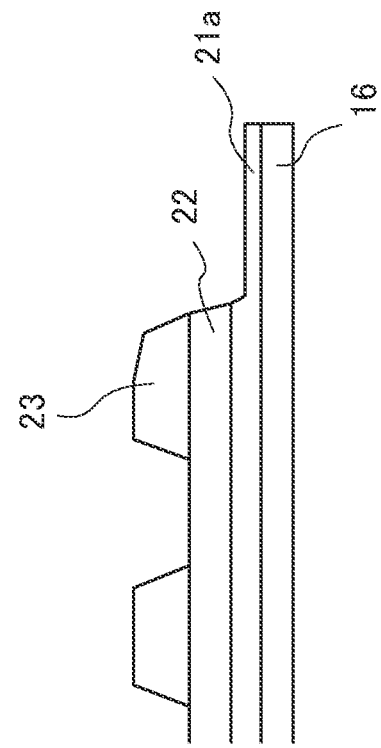
Figure 2G:
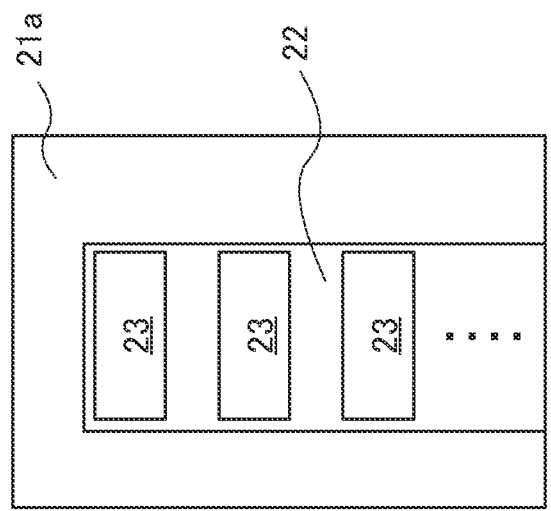

Then, the mask 25 is removed as depicted in FIGS. 2G and 2H.

In general, in the case where elements and/or patterns are nonuniformly formed on a substrate, a capacitor 20 adjacent to an open space (that is, a sparse region) may be exposed to more reaction product from the open space during etching. Thus, more reaction product adheres to the side wall of the etching mask, and a fence-like residue may remain after the etching mask is removed.

However, according to this embodiment, the etching mask may be formed in such a manner that the end part of the top electrode may be exposed, and therefore, the distance between the side wall of the etching mask and the dielectric layer may be increased. As a result, the amount of the reaction product that adheres to the side wall of the etching mask may be reduced. Furthermore, as the dielectric layer is etched, the taper angle of the side wall of the resist mask becomes significant, and the amount of etching becomes larger than the amount of the reaction product that adheres to the side wall. Thus, adhesion of the reaction product to the side wall of the mask 25 may be suppressed. Thus, a structure that has no fence-like residue after the mask 25 is removed may be formed as depicted in FIGS. 2G and 2H.

Then, an AlO film (having a thickness of about 50 nm) serving as a protective film is formed, and a resist pattern that covers the top electrodes 23 and the dielectric layer 22 is formed. By using the resist pattern and using e.g., the ICP type apparatus and the $Cl_2$/Ar-based etching gas as with the top electrodes, the bottom electrode layer 21a is etched to form the bottom electrode 21.

Then, an AlO film 26 (having a thickness of about 20 nm) is formed by sputtering, a silicon oxide film (having a thickness of about 1400 nm) is formed on the ALO film 26, and then, the surface is planarized by e.g., CMP. Then, in order to dehydrate the ALO film 26, $N_2O$ plasma annealing is carried out. Then, an AlO film having a thickness of about 50 nm serving as a protective film is formed, and then, a silicon oxide film (having a thickness of about 300 nm) is formed by e.g., plasma enhanced CVD. In this way, an interlayer insulating film 27 having a multilayer structure is formed.

Figure 3:
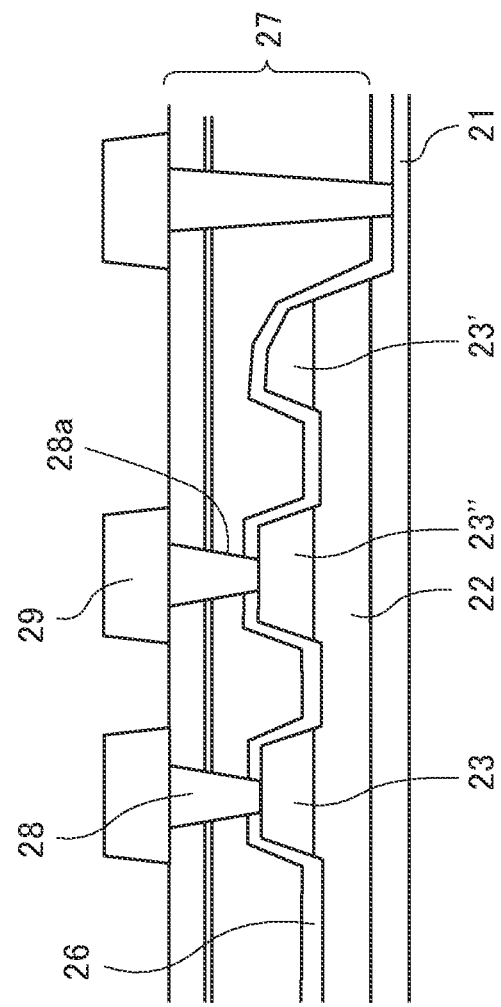
FIG. 3 is a schematic cross-sectional view illustrating a structure of the semiconductor device manufactured according to the embodiment.

Then, as depicted in FIG. 3, via holes 28a are formed in the interlayer insulating film 27. The via holes 28a are formed by patterning the layers of the interlayer insulating film 27 above the top electrodes 23 and the bottom electrode 21 of the capacitors by lithography and dry etching. Thus, the surface of the top electrodes 23 and the bottom electrode 21 may be partially exposed.

A via hole may also be formed on the outermost top electrode 23. However, according to this embodiment, as depicted in FIG. 3, no via hole is formed on an outermost top electrode 23'. The reason why it may be preferred that no via hole is formed on the outermost top electrode is that when a plug is embedded in the via hole in a subsequent step, the dielectric layer may be damaged over a wide area because coverage of the lower layer (barrier metal, for example) may be poor.

Although the capacitor including the outermost top electrode 23' may be used as an operative memory cell, the capacitor may be eventually used as a dummy capacitor that does not contribute to operation. This is because the surface of the outermost top electrode 23' may be partially etched, so that the coverage of the outermost top electrode 23' differs from the coverage of the other top electrodes 23, and therefore, the outermost top electrode 23' may be affected by hydrogen gas when a plug is formed in the via hole in a subsequent step.

Furthermore, according to this embodiment, the capacitor including a top electrode 23" adjacent to the outermost top electrode 23' (second outermost top electrode 23") may be eventually used as a dummy capacitor.

It is common practice to form a via hole on the outermost top electrode to recover damage to the dielectric layer or the like. However, according to this embodiment, no via hole is formed on the outermost top electrode 23', but a via hole may be formed on the top electrode 23" adjacent to the outermost top electrode on the inner side thereof, and the via hole may be used to recover damage to the dielectric layer or the like.

Since the via hole may be formed also on the capacitor that is eventually used as a dummy capacitor as described above, a subsequent semiconductor processing, specifically, oxygen recovery annealing or the like, may be made more effective.

Then, in order to recover the damage occurring in etching of the capacitors, oxygen annealing is carried out.

Then, as depicted in FIG. 1, a via hole that connects to the previously formed plug 15 is formed in the interlayer insulating film 27.

Then, plugs 28 are formed in the via holes formed in the interlayer insulating film 27. First, a glue film (a TiN film having a thickness of about 100 nm) is formed on the wall of each via hole by sputtering, for example, and then a tungsten film is formed thereon by e.g., CVD. Then, using the interlayer insulating film 27 as a stopper, these films are polished by e.g., CMP. In this way, the plugs 28 are formed.

Then, on the interlayer insulating film 27, first aluminum wiring 29 is formed with a Ti film (having a thickness of about 60 nm) and a TiN film (having a thickness of about 30 nm) serving as a barrier metal interposed therebetween. Furthermore, an AlCu film (having a thickness of about 360 nm), a Ti film (having a thickness of about 5 nm), a TiN film (having a thickness of about 70 nm), and a SION film serving as an antireflection film are formed in this order. Then, these films are patterned into a desired shape. The first aluminum wiring may be also used in a logic product of substantially the same rule other than the FeRAM, so that the wiring may be well processed and has high reliability. Furthermore, the material of the wiring is not limited to an aluminum-based material, and the wiring may be made of any wiring material used in the art, such as a Cu-based material, and/or have any thickness.

Then, a multilayer (5-layer) wiring layer, such as one depicted in FIG. 1, may be formed by repeating formation of the interlayer insulating film, planarization of the surface thereof, formation of the via holes, formation of the plugs, formation of the wiring and the like.

Finally, a cover film 30 and a polyimide film 31 are formed, and then these films are patterned to complete the FeRAM device.

The manufacturing method described above may be particularly useful for a structure in which a plurality of capacitors are arranged in one direction, and sparse patterns and/or dense patterns are formed around the capacitors as depicted in FIG. 3. That is, since the dielectric layer may be etched by using a mask that leaves a part of a top electrode adjacent to a sparse pattern (that is, a part of the top electrode 23') exposed, a fence-like residue may be prevented from remaining.

The semiconductor device manufactured as described above has no fence-like residue and therefore may have a high reliability even though the plurality of capacitors arranged in the y direction share the bottom electrode 21 and the dielectric layer.

Second Embodiment

A method of manufacturing a semiconductor device according to an embodiment 2 will be described with reference to FIG. 4.

As in the embodiment 1, a bottom electrode layer, a dielectric layer and a top electrode layer are formed on a substrate 10 in this order. Then, as depicted in FIG. 4A, the top electrode layer may be patterned to form top electrodes 23. Then, a dielectric layer 22 is patterned into a desired shape.

Figure 4B:
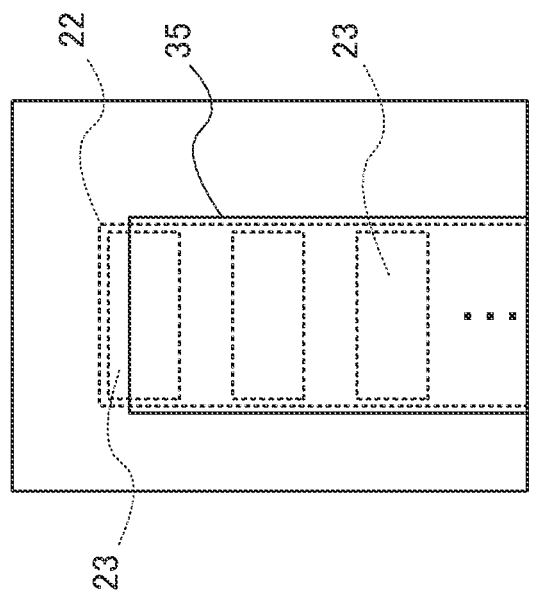
Figure 4C:
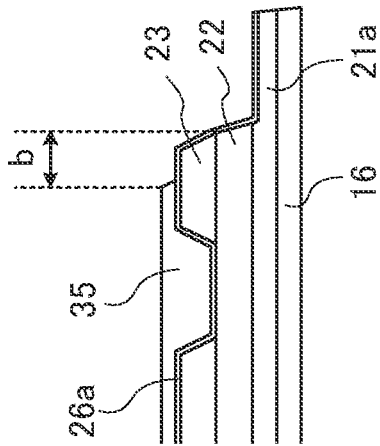

Then, an AlO film 26a (having a thickness of about 50 nm) serving as a protective film is formed, and a resist layer is applied to the upper surface of the top electrodes 23 and patterned by exposure and development. In this way, an etching mask 35 for a bottom electrode layer 21a is formed as depicted in FIGS. 4B and 4C.

The mask 35 may be formed in such a manner that one end part (upper end part in FIG. 4B) of the outermost top electrode 23 at one end (upper end in FIG. 4B) in the arrangement of top electrodes 23 in the y direction, for example, is exposed. The width of the exposed part of the top electrode 23 may be preferably determined in the same manner as in the embodiment 1. In this embodiment, the width of the exposed part of the top electrode 23 (denoted by "b" in FIG. 4C) may be about 0.2 μm. The mask 35 covers the dielectric layer 22 and a plurality of top electrodes 23 including the partially covered outermost top electrode 23 at the upper end of the arrangement in FIG. 4B. The number of the top electrodes 23 arranged in the y direction and integrally covered by the mask 35 is not limited to a particular value, and the mask 35 may cover any plural number of top electrodes 23.

Then, using the mask 35 and using e.g., the ICP type apparatus and a Cl$_2$/Ar-based etching gas as with the top electrodes, the bottom electrode layer 21a is etched to form a bottom electrode 21. In this process, since the end part of the outermost top electrode 23 is exposed, the end part of the outermost top electrode 23 may be also etched as depicted in FIG. 4D. Thus, the thickness of the outermost top electrode 23 decreases in the y direction. Thus, the outermost top electrode 23 has a shape different from the shape of the other top electrodes 23.

Then, the mask 35 and the ALO film 26a are removed as depicted in FIGS. 4E and 4F.

The etching makes the tapered shape of the side wall of the mask 35 more remarkable, and thus, the amount of etching becomes larger than the amount of the reaction product that adheres to the side wall of the mask 35. Thus, adhesion of the reaction product to the side wall of the mask 35 may be suppressed. Thus, a structure that has no fence-like residue after the mask 35 is removed may be formed as depicted in FIGS. 4E and 4F.

Then, as in the embodiment 1, an interlayer insulating film 27 is formed.

Figure 5:
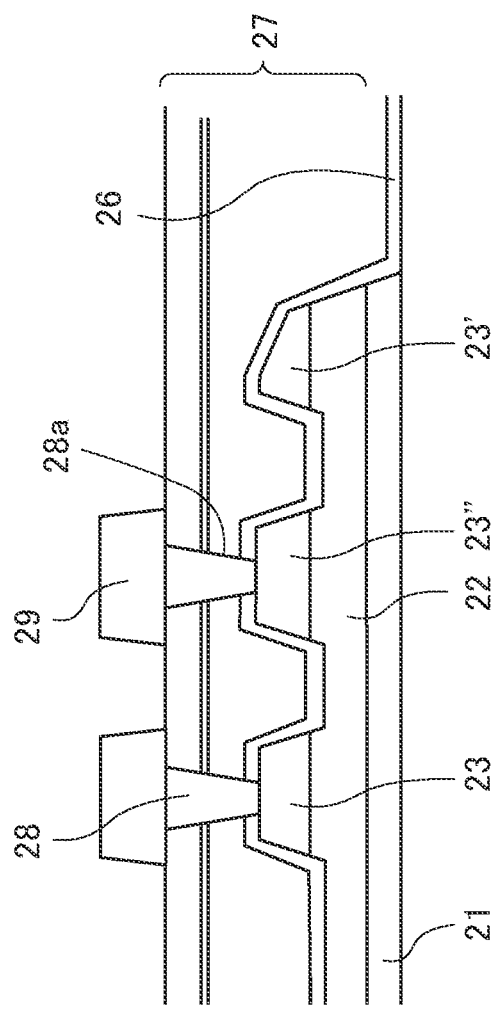
FIG. 5 is a schematic cross-sectional view illustrating a structure of a semiconductor device manufactured according to another embodiment.

Then, as depicted in FIG. 5, via holes 28a are formed in the interlayer insulating film 27. The via holes 28a may be formed by patterning the interlayer insulating film 27 above the top electrodes 23 of the capacitors by e.g., lithography and dry etching. Thus, the surface of the top electrodes 23 may be partially exposed.

As in the embodiment 1, although a via hole may also be formed on an outermost top electrode 23', no via hole is preferably formed on the outermost top electrode 23'. Furthermore, although the capacitor including the outermost top electrode 23' and/or the capacitor including a top electrode 23" adjacent to the top electrode 23' may be used as an operative cell, the capacitors may be preferably used as a dummy capacitor.

In addition, a via hole for the bottom electrode 21 may be preferably formed in the interlayer insulating film according to the peripheral patterns of the capacitors on the substrate. The via hole may be formed at a position close to the dummy capacitor that does not function as a memory cell or a pattern used as a capacitor (not depicted), for example. If such a via hole is formed, a contact to the bottom electrode 21 may be formed at a desired position.

Then, by the substantially same process as in the embodiment 1, the FeRAM device is completed.

The semiconductor device manufactured as described above may have a planarized upper surface without a fence-like residue, even though the semiconductor device is manufactured by the simple manufacturing method described above. Therefore, the reliability of subsequent formation of the wiring or the like may be improved.

Third Embodiment

A method of manufacturing a semiconductor device according to an embodiment 3 will be described with reference to FIGS. 6 to 8.

Figure 6:
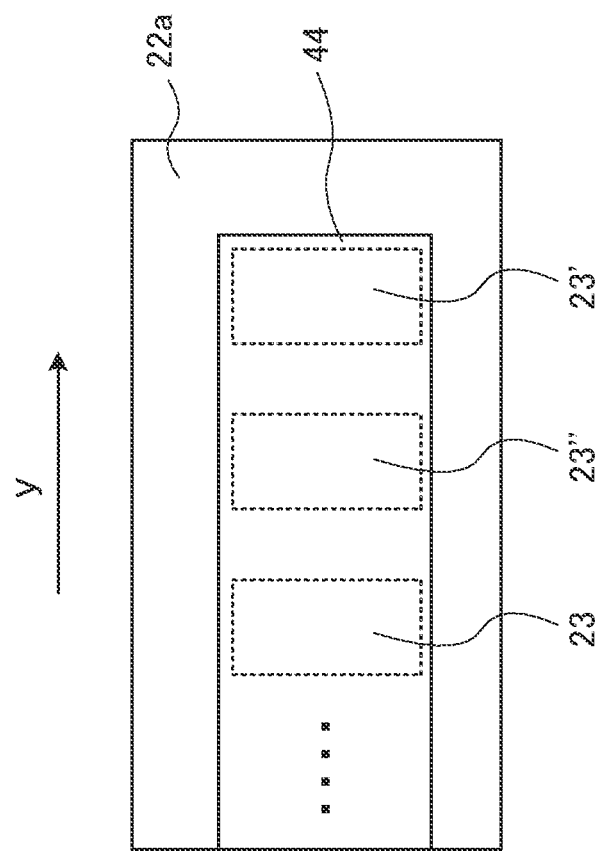
FIG. 6 is a schematic view illustrating a structure of a semiconductor device manufactured according to further embodiment.

As in the embodiment 1, a bottom electrode layer, a dielectric layer and a top electrode layer are formed on a substrate 10 in this order, and then, the top electrode layer is patterned to form top electrodes 23 (see FIG. 6).

Then, a resist layer is applied to the upper surface of the top electrodes 23 and patterned by exposure and development to form an etching mask 44 for a dielectric layer 22a as depicted in FIG. 6.

The mask 44 is integrally formed to completely cover a plurality of top electrodes 23', 23" and 23 arranged in the y direction, for example. The number of the top electrodes arranged in the y direction and integrally covered by the mask 44 is not limited to a particular value, and the mask 44 may cover any plural number of top electrodes 23.

Then, using the mask 44, the dielectric layer 22a is etched in the same manner as for the top electrodes, and then, the mask 44 is removed. In the vicinity of one end of the top electrode 23', a reaction product may firmly adhere to the side wall of the mask 44, and a fence-like residue 46 may remain even after the mask 44 is removed as depicted in FIG. 8.

Figure 7:
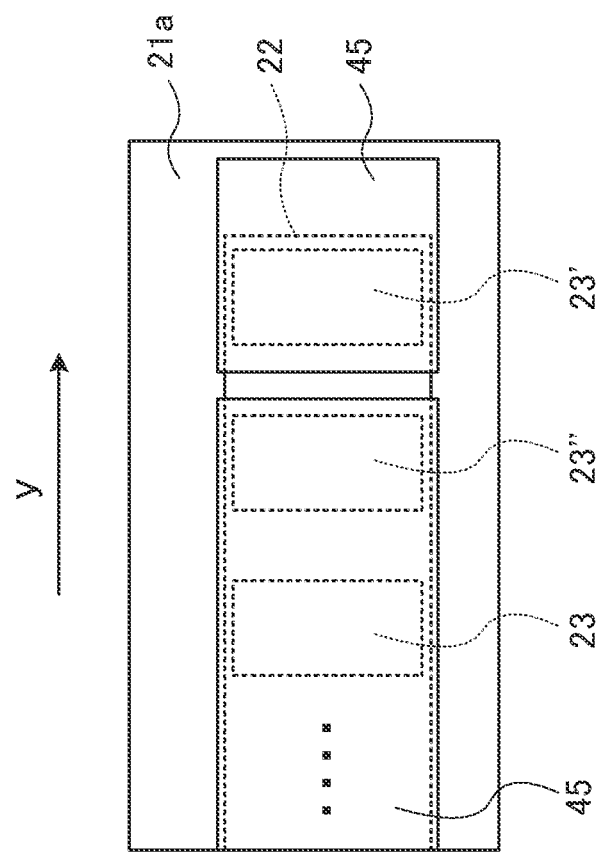
FIG. 7 is a schematic view illustrating a structure of the semiconductor device according to the further embodiment.

Then, an AlO film (having a thickness of about 50 nm) serving as a protective film (not depicted) is formed, and a resist layer is applied to the upper surface of the top electrodes 23 and patterned by exposure and development to form an etching mask 45 for a bottom electrode layer 21a as depicted in FIG. 7.

For example, the mask 45 may be divided at a position between the outermost top electrode 23' at one end (right end in FIG. 7) of the arrangement in the y direction and the top electrode 23" adjacent thereto. The distance between the mask 45 on the top electrode 23' and the mask 45 on the top electrode 23" is not limited to a particular value. However, in general, there is a problem concerning the mask alignment accuracy in patterning, for example, and therefore, the distance may be preferably determined by taking the mask misalignment into account. In this embodiment, the distance may be about 0.2 μm. The mask 45 integrally cover the outermost top electrode 23' and the dielectric layer 22 there below and the top electrodes 23 other than the outermost top electrode 23' and the dielectric layer 22 there below, respectively. The number of the top electrodes 23 arranged in the y direction and integrally covered by the mask 45 is not limited to a particular value, and the mask 45 may cover any plural number of top electrodes.

Then, using the mask 45, the bottom electrode layer 21a is etched in substantially the same manner as for the top electrodes to form bottom electrodes 21. In this process, a part of the dielectric layer 22 between the top electrode 23' and the top electrode 23" may also be etched, and the dielectric layer 22 and the bottom electrode 21 may be divided at the part between the top electrode 23' and the top electrode 23".

Then, the mask 45 is removed.

Figure 8:
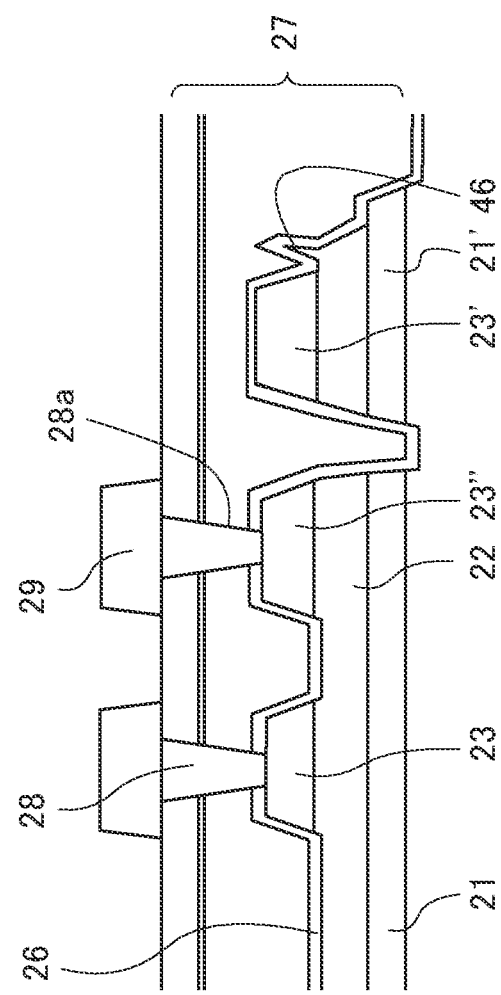
FIG. 8 is a schematic cross-sectional view illustrating a structure of the semiconductor device according to the further embodiment.
Figure 9A:
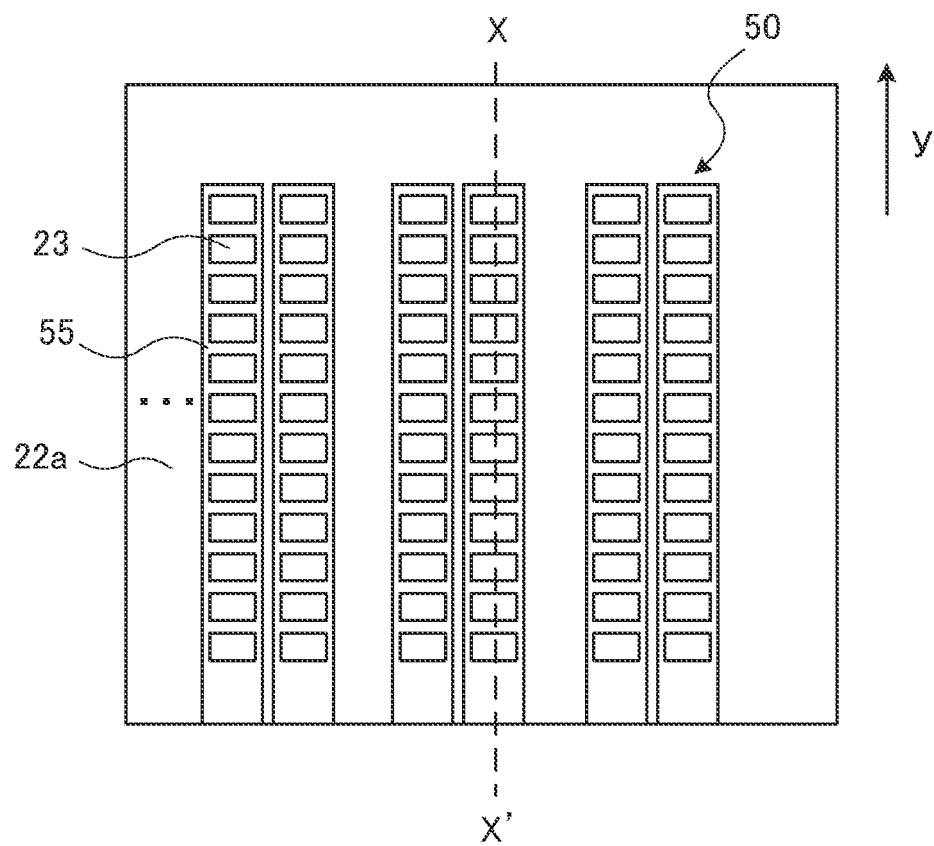
FIGS. 9A to 9B are a schematic view and a schematic cross-sectional view illustrating a structure of a conventional semiconductor device.
Figure 9B:
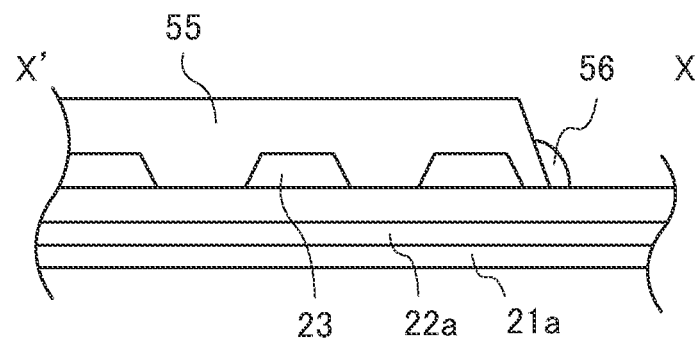

Then, as in the embodiment 1, an interlayer insulating film 27 is formed, and via holes 28a are formed in the interlayer insulating film 27 as depicted in FIG. 8. The via holes 28a may be formed by patterning the interlayer insulating film 27 above the top electrodes 23 of the capacitors by e.g., lithography and dry etching. Thus, the surface of the top electrodes 23 may be partially exposed.

As in the embodiment 1, although a via hole may also be formed on the outermost top electrode 23', no via hole is preferably formed on the outermost top electrode 23'. Furthermore, although the capacitor including the outermost top electrode 23' and/or the capacitor including a top electrode 23" adjacent to the top electrode 23' may be used as an operative cell, the capacitors may be preferably used as a dummy capacitor. In that case, as depicted in FIG. 8, even if a fence-like residue 46 occurs on the outermost top electrode 23', the capacitor including the outermost top electrode 23' may be separated from the actually used operative cells.

A via hole may be preferably formed in the interlayer insulating film at a position close to the dummy capacitor or a pattern used as a capacitor (not depicted), for example, according to the peripheral patterns of the capacitors on the substrate. If such a via hole is formed, a contact to the bottom electrode 21 may be formed at a desired position.

Then, by substantially the same process as in the embodiment 1, the FeRAM device is completed.

As depicted in FIG. 8, the semiconductor device manufactured as described above has a plurality of capacitors each including the bottom electrode 21, the dielectric layer 22 and the top electrode 23 and arranged in one direction, for example, the y direction. The plurality of capacitors arranged in the y direction share the bottom electrode 21, and the bottom electrode 21' opposed to the outermost top electrode 23' at one end of the arrangement in the y direction is separated from the adjacent bottom electrode 21.

The semiconductor device has high reliability as with the semiconductor devices according to the embodiments described above.

In the embodiments 1 to 3, the top electrode layer, the dielectric layer and the bottom electrode layer are etched using different masks. Alternatively, however, the dielectric layer and the bottom electrode layer may be etched using substantially the same etching mask for a ferroelectric. Furthermore, the top electrode layer and the dielectric layer may be etched using the same mask, and only the bottom electrode layer may be etched using a different mask.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A semiconductor device, comprising:
    a plurality of capacitors including a bottom electrode, a dielectric layer formed on said
    bottom electrode, and a plurality of top electrodes arranged in a column on said dielectric layer,
    wherein the shape of the surface of the outermost top electrode in the column differs from the
    shape of the surface of the top electrode adjacent to the outermost top electrode in the column; and
    wherein the shape of the surface of the outermost top electrode differs from the shape of the
    surface of the top electrode adjacent to the outermost top electrode in the column because at least an
    end part of the surface of the outermost top electrode in the column is etched.

2. The semiconductor device according to claim 1, wherein an outermost capacitor including a outermost top electrode is provided as a dummy capacitor.

3. The semiconductor device according to claim 1, wherein the capacitor including the outermost top electrode and the capacitor adjacent to the capacitor are provided as dummy capacitors.

4. The semiconductor device according to claim 3, further comprising:
    an interlayer film formed over said capacitors,
    wherein a via hole is formed in said interlayer film on the top electrode adjacent to the outermost top electrode.

5. The semiconductor device according to claim 1, further comprising:
    an interlayer film formed over said capacitors,
    wherein a via hole is formed in said interlayer film on said outermost top electrode.

6. The semiconductor device according to claim 5, wherein a conductive plug is embedded in said via hole.

7. The semiconductor device according to claim 1, wherein said plurality of capacitors share the bottom electrode.

8. The semiconductor device according to claim 1, wherein said dielectric layer is a single layer or a multilayer of one or more materials selected from the group consisting of PZT ferroelectric, Bi layer structure ferroelectric, metal oxide ferroelectric, and bismuth ferrite ferroelectric.

* * * * *